(12) United States Patent
Fukasawa

(10) Patent No.: US 10,943,963 B2
(45) Date of Patent: Mar. 9, 2021

(54) DISPLAY DEVICE

(71) Applicant: Samsung Display Co., Ltd., Yongin-Si (KR)

(72) Inventor: Takayuki Fukasawa, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/273,044

(22) Filed: Feb. 11, 2019

(65) Prior Publication Data

US 2019/0348483 A1 Nov. 14, 2019

(30) Foreign Application Priority Data

May 11, 2018 (KR) ........................ 10-2018-0054566

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 27/3262* (2013.01); *H01L 27/3265* (2013.01); *H01L 51/5036* (2013.01); *H01L 51/5206* (2013.01); *H01L 51/5221* (2013.01); *H01L 2227/323* (2013.01)

(58) Field of Classification Search
CPC .................................................. H01L 27/3246
See application file for complete search history.

(56) References Cited

U.S. PATENT DOCUMENTS

| 6,339,288 | B1 | 1/2002 | Qian et al. |
| 8,933,450 | B2 | 1/2015 | Kim et al. |
| 9,224,980 | B2 | 12/2015 | Yamazaki et al. |
| 2011/0101359 | A1* | 5/2011 | Kim ............... H01L 27/3246 257/59 |
| 2013/0038203 | A1* | 2/2013 | Kim ............... H01L 51/5265 313/504 |
| 2015/0206927 | A1* | 7/2015 | Kuroda ............ H05B 33/28 257/40 |
| 2017/0005148 | A1 | 1/2017 | Kwon |
| 2018/0183016 | A1 | 6/2018 | Kuwabara et al. |

FOREIGN PATENT DOCUMENTS

| JP | 2006-049172 A | 2/2006 |
| JP | 2012-138382 A | 7/2012 |
| JP | 2014-209480 A | 11/2014 |
| KR | 10-2001-0012097 A | 2/2001 |
| KR | 10-2011-0049578 A | 5/2011 |
| KR | 10-2017-0002842 A | 1/2017 |
| WO | 2013-190661 A | 12/2013 |

* cited by examiner

*Primary Examiner* — William A Harriston
(74) *Attorney, Agent, or Firm* — Innovation Counsel LLP

(57) ABSTRACT

A display device may include a substrate, a plurality of pixel electrodes, a pixel defining layer, a first intermediate layer, and a first opposite electrode. The plurality of pixel electrodes may overlap the substrate and may include a first pixel electrode. The pixel defining layer may include a concave surface. The concave surface may partially overlap the first pixel electrode. A part of the concave surface may be positioned between the first intermediate layer and the first pixel electrode. The first intermediate layers may be positioned between the first opposite electrode and the part of the concave surface.

20 Claims, 12 Drawing Sheets

DISPLAY DEVICE

CROSS-REFERENCE TO RELATED APPLICATION

This application claims the benefit of Korean Patent Application No. 10-2018-0054566, filed on May 11, 2018, in the Korean Intellectual Property Office; the disclosure of the Korean Patent Application is incorporated herein in its entirety by reference.

BACKGROUND

1. Field

The technical field relates to a display device.

2. Description of the Related Art

An organic light-emitting display device may include pixels, each of which includes an organic light-emitting diode. The organic light-emitting diode includes a pixel electrode, an emission layer, and an opposite electrode.

In a color organic light-emitting display device, pixels may emit different colored lights. Emission layers and electrodes of the pixels may be formed using deposition masks.

SUMMARY

Embodiments may minimize or prevent damage potentially caused by a deposition mask, a deposition process, and/or a deposited structure. One or more embodiments may be related to a display device including intermediate layers and opposite electrodes. One or more embodiments may be related to a method of manufacturing the display device.

According to one or more embodiments, a display device includes the following elements: a substrate; a plurality of pixel electrodes on the substrate; a pixel defining layer including a side surface that is concavely curved, the pixel defining layer covers an edge of each of a first pixel electrode and a second pixel electrode, which are adjacent to each other among the pixel electrodes; a first intermediate layer disposed on a part of the curved side surface of the pixel defining layer and on the first pixel electrode; a second intermediate layer disposed on a part of the curved side surface of the pixel defining layer and on the second pixel electrode; and first and second opposite electrodes respectively disposed on the first and second intermediate layers, and spaced apart from each other.

A vertical distance from a first point where the first pixel electrode and the curved side surface of the pixel defining layer meet to a top surface of the pixel defining layer may be substantially equal to a horizontal distance from a point where a virtual axis on a same line as the vertical distance and a virtual plane identical to the top surface meet to the curved side surface of the pixel defining layer.

The vertical distance may be from 500 nm to 3000 nm.

A first thickness of a first portion of the first intermediate layer, which corresponds to a first point where the first pixel electrode and the curved side surface of the pixel defining layer meet, may be smaller than a second thickness of a second portion of the first intermediate layer, which corresponds to a center of the first pixel electrode.

The first thickness may be in a range of 0.45 times to 0.5 times the second thickness.

A thickness of the first intermediate layer may decrease from a point corresponding to the center of the first pixel electrode towards the first point.

An end portion of the first opposite electrode may extend beyond an end portion of the first intermediate layer and directly contact the curved side surface of the pixel defining layer.

The first intermediate layer may include: a first emission layer emitting a first colored light; and at least one of a first functional layer between the first pixel electrode and the first emission layer and a second functional layer between the first emission layer and the first opposite electrode.

The first intermediate layer may include the first functional layer, and an end portion of the first emission layer may extend beyond an end portion of the first functional layer and contact the curved side surface of the pixel defining layer.

The first intermediate layer may include the second functional layer, and an end portion of the second functional layer may extend beyond an end portion of the first emission layer and contact the curved side surface of the pixel defining layer.

An end portion of the first opposite electrode may extend beyond the end portion of the second functional layer and contact the curved side surface of the pixel defining layer.

The pixel defining layer may have a top surface connected to the curved side surface, and the end portion of the first opposite electrode may not contact the top surface.

The display device may further include a first protection layer provided on the first opposite electrode, wherein an end portion of the first protection layer may contact the curved side surface of the pixel defining layer.

According to one or more embodiments, a method of manufacturing a display device includes the following elements: preparing a substrate where pixel electrodes are formed; forming a pixel defining layer including a side surface that is concavely curved with respect to a top surface of the first pixel electrode and covers an edge of a first pixel electrode among the pixel electrodes; forming a protection resin layer and a photosensitive resin layer each including an opening region exposing the first pixel electrode; forming a first intermediate layer on the first pixel electrode by using the protection resin layer and the photosensitive resin layer; and forming a first opposite electrode on the first intermediate layer by using the protection resin layer and the photosensitive resin layer.

An end portion of the opening region of the photosensitive resin layer may be provided on a same line as a first point where the first pixel electrode and the curved side surface of the pixel defining layer meet.

A thickness of the first intermediate layer at a first point where the first pixel electrode and the curved side surface of the pixel defining layer meet may be smaller than a second thickness of the first intermediate layer at a second point corresponding to a center of the first pixel electrode.

The first thickness may be in a range of 0.45 times to 0.5 times the second thickness.

A thickness of the first intermediate layer may decrease from the second point towards the first point.

The first opposite electrode may extend beyond an end portion of the first intermediate layer and contact the curved side surface of the pixel defining layer.

The pixel defining layer may further include: a side surface that covers an edge of a second pixel electrode neighboring the first pixel electrode and is curved with respect to a top surface of the second pixel electrode; and an upper surface provided between the curved side surface corresponding to the first pixel electrode and the curved side surface corresponding to the second pixel electrode, wherein the first opposite electrode does not contact the upper surface.

One or more embodiments may be related to a display device. The display device may include a substrate, a plurality of pixel electrodes, a pixel defining layer, a first intermediate layer, and a first opposite electrode. The plurality of pixel electrodes may overlap the substrate and may include a first pixel electrode. The pixel defining layer may include a concave surface. The concave surface may partially overlap the first pixel electrode. A part of the concave surface may be positioned between the first intermediate layer and the first pixel electrode. The first intermediate layers may be positioned between the first opposite electrode and the part of the concave surface.

A first plane may be perpendicular to a face of the substrate. A second plane may be parallel to the face of the substrate. The concave surface includes a first edge and a second edge. The first edge may be positioned in the first plane and may directly contact the first pixel electrode. The second edge may be positioned in the second plane. A vertical distance from the first edge to the second plane may be substantially equal to a horizontal distance from the first plane to the second edge.

The vertical distance may be in a range from 500 nm to 3000 nm.

An edge of the concave surface may be positioned between a first portion of the first intermediate layer and the first pixel electrode in a direction that is perpendicular to a face of the substrate. The pixel defining layer may expose a portion of the first pixel electrode. A second portion of the first intermediate layer may be positioned on the portion of the first pixel electrode. A thickness of the first portion of the first intermediate layer in the direction may be smaller than a thickness of the second portion of the first intermediate layer in the direction.

The thickness of the first portion of the first intermediate layer may be in a range of 0.45 times the thickness of the second portion of the first intermediate layer to 0.5 times the thickness of the second portion of the first intermediate layer.

A thickness of the first intermediate layer may decrease from the portion of the first pixel electrode towards the edge of the concave surface.

The first opposite electrode may extend beyond the first intermediate layer and may directly contact the concave surface.

The first intermediate layer may include a first emission layer for emitting a first colored light. The first intermediate layer may include at least one of a first functional layer between the first pixel electrode and the first emission layer and a second functional layer between the first emission layer and the first opposite electrode.

The first intermediate layer may include the first functional layer, and

The first emission layer extends beyond the first functional layer and may directly contact the concave surface.

The first intermediate layer may include the second functional layer. The second functional layer may extend beyond the first emission layer and may directly contact the concave surface.

The first opposite electrode may extend beyond the second functional layer and may directly contact the concave surface.

The pixel defining layer may have a flat surface connected to the concave surface. The first opposite electrode may not directly contact the flat surface.

The display device may include a first protection layer provided on the first opposite electrode. An end portion of the first protection layer may directly contact the concave surface.

One or more embodiments may be related to a method of manufacturing a display device. The method may include the following steps: preparing a substrate; providing pixel electrodes on the substrate, the pixel electrodes including a first pixel electrode; forming a pixel defining layer comprising a concave surface that partially overlaps the first pixel electrode; forming a first intermediate layer, wherein a part of the concave surface may be positioned between the first intermediate layer and the first pixel electrode; and forming a first opposite electrode, wherein the first intermediate layer may be positioned between the first opposite electrode and the part of the concave surface.

The method may include providing a photosensitive resin layer comprising an opening that exposes the first pixel electrode. At least one of the first intermediate layer and first opposite electrode may be formed using the photosensitive resin layer. An edge of the opening may be aligned with an edge of the concave surface in a direction perpendicular to the substrate. The first pixel electrode may directly contact the edge of the concave surface.

The pixel defining layer exposes a portion of the first pixel electrode. In a direction perpendicular to the substrate, a first thickness of the first intermediate layer at an edge of the concave surface may be smaller than a second thickness of the first intermediate layer at the portion of the first pixel electrode.

The first thickness may be in a range of 0.45 times the second thickness to 0.5 times the second thickness.

A thickness of the first intermediate layer may decrease from the portion of the first pixel electrode towards the edge of the concave surface.

The first opposite electrode may extend beyond the first intermediate layer and may directly contact the concave surface.

The pixel electrodes may further include a second pixel electrode. The pixel defining layer may further include a curved surface that partially overlaps the second pixel electrode. The pixel defining layer may further include a flat surface connected between the concave surface and the curved surface. The first opposite electrode may not directly contact the flat surface.

DETAILED DESCRIPTION

Figure 1:
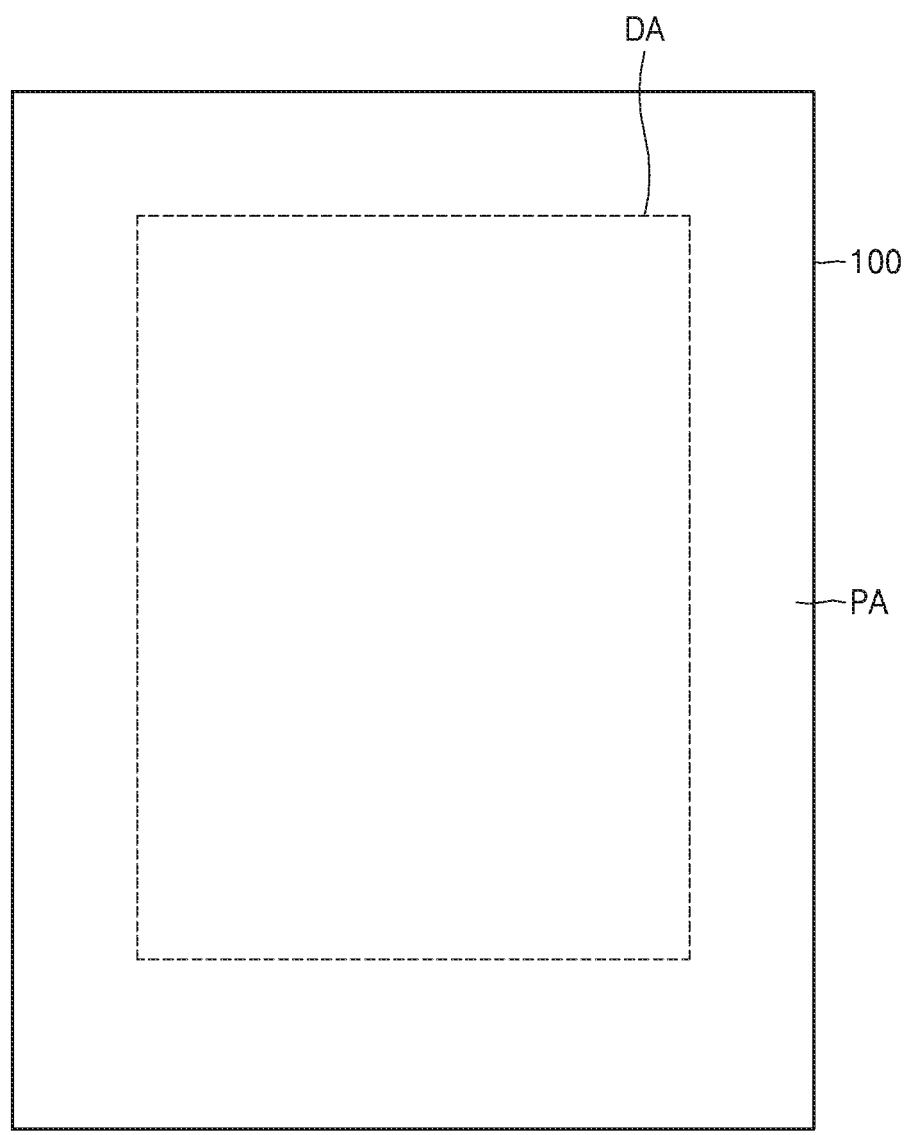
FIG. 1 is a plan view schematically illustrating a display device according to an embodiment.

Example embodiments are described with reference to the accompanying drawings. The described embodiments may have different forms and should not be construed as being limited to the descriptions.

In drawings, like reference numerals may refer to like elements.

Although the terms "first," "second," etc. may be used herein to describe various components, these components should not be limited by these terms. These components are used to distinguish one component from another. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

As used herein, the singular forms "a," "an" and "the" may include the plural forms as well, unless the context clearly indicates otherwise.

The terms "comprises" and/or "comprising" used herein may specify the presence of stated features or components, but may not preclude the presence or addition of one or more other features or components.

When a first component is referred to as being "on" or "connected to" a second component, the first component can be directly or indirectly on or connected to the second component.

Sizes of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

The term "connect" may mean "electrically connect"; the term "meet" may mean "directly contact."

FIG. 1 is a plan view schematically illustrating a display device according to an embodiment.

Referring to FIG. 1, the display device includes a display area DA capable of displaying a certain image and a peripheral area PA outside the display area DA. The peripheral area PA may surround the display area DA. FIG. 1 may illustrate a structure of a substrate 100 in the display device. For example, the substrate 100 may include the display area DA and the peripheral area PA. The plan view is on an x-y plane. A thickness of the substrate 100 is in the z direction perpendicular to the x-y plane and/or perpendicular to a bottom face of the substrate 100.

Pixels for emitting different colored lights are arranged in the display area DA. The peripheral area PA is a non-display area. A driver, a power voltage supply line, etc. for providing electric signals and/or power voltages to the pixels may be arranged in the peripheral area PA. The peripheral area PA may include a conductive pad, to which an electronic device or a printed circuit board (PCB) may be electrically connected.

Figure 2:
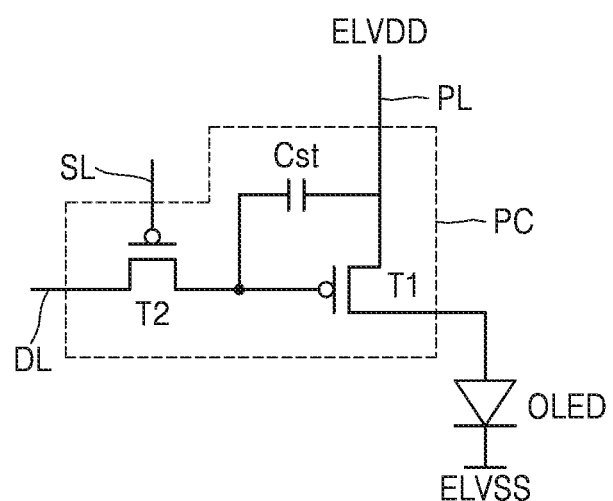
FIG. 2 is an equivalent circuit diagram of a pixel of a display device according to an embodiment.

FIG. 2 is an equivalent circuit diagram of any one pixel of a display device, according to an embodiment.

Referring to FIG. 2, a pixel includes a pixel circuit PC and a display element connected to the pixel circuit PC. In FIG. 2, an organic light-emitting diode OLED is illustrated as the display element. The pixel circuit PC may include a first thin-film transistor T1, a second thin-film transistor T2, and a storage capacitor Cst.

The second thin-film transistor T2 is a switching thin-film transistor, connected to a scan line SL and a data line DL, and transmits, to the first thin-film transistor T1, a data voltage input from the data line DL based on a switching voltage input from the scan line SL. The storage capacitor Cst is connected to the second thin-film transistor T2 and a driving voltage line PL, and stores a voltage corresponding to a difference between a voltage received from the second thin-film transistor T2 and a first power voltage ELVDD supplied to the driving voltage line PL.

The first thin-film transistor T1 is a driving thin-film transistor, is connected to the driving voltage line PL and the storage capacitor Cst, and may control a driving current Id flowing from the driving voltage line PL to the organic light-emitting diode OLED according to a voltage value stored in the storage capacitor Cst. The organic light-emitting diode OLED may emit a light having certain luminance, based on the driving current Id. An opposite electrode (for example, a cathode) of the organic light-emitting diode OLED may receive a second power voltage ELVSS.

In FIG. 2, the pixel circuit PC includes two thin-film transistors and one storage capacitor. The number of thin-film transistors and the number of storage capacitors may be configured according to a design of the pixel circuit PC.

FIGS. 3 through 8 are cross-sectional views illustrating elements in a display device and illustrating structures formed in a method of manufacturing a display device according to an embodiment.

Figure 3:
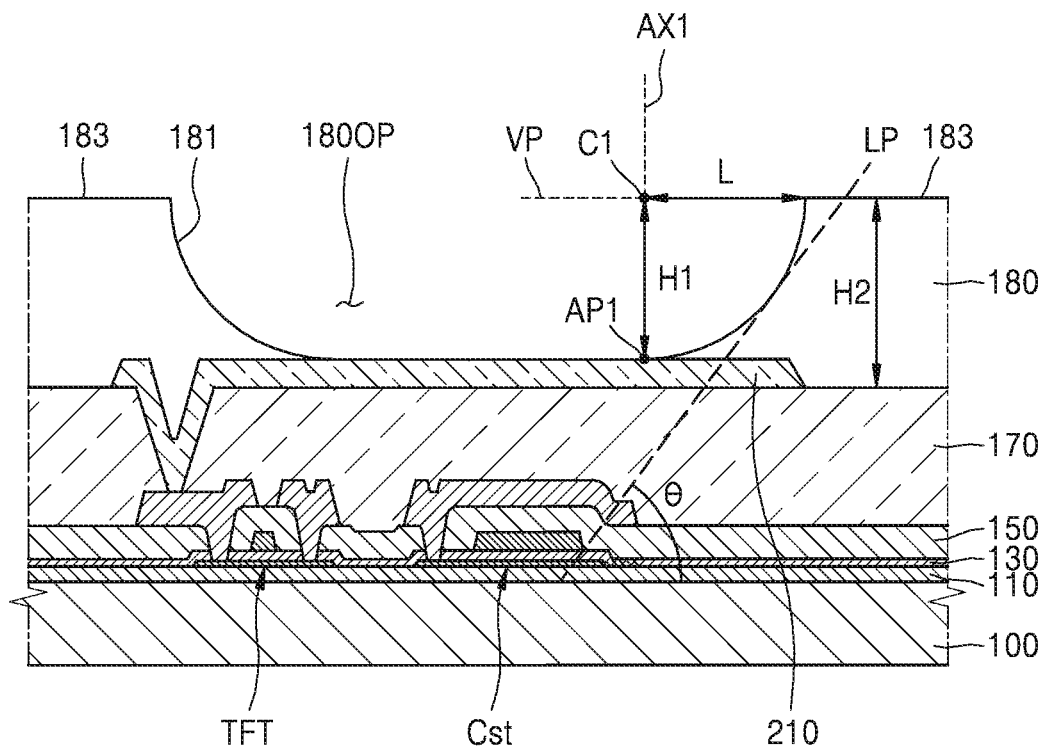
FIG. 3.

Referring to FIG. 3, the substrate 100 where a pixel electrode 210 is formed is prepared. The substrate 100 may include polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

Various layers may be formed before the pixel electrode 210 is formed. In FIG. 3, a thin-film transistor TFT and the storage capacitor Cst are formed on the substrate 100, a planarization insulating layer 170 covering the thin-film transistor TFT and the storage capacitor Cst is formed, and then the pixel electrode 210 is formed on the planarization insulating layer 170. In FIG. 3, one pixel electrode 210 is illustrated; a pixel electrode is provided per pixel of the display device.

A buffer layer 110, a gate insulating layer 130, and an interlayer insulating layer 150 may include an inorganic insulating material, such as silicon oxide ($SiO_x$), silicon nitride ($SiN_x$), or silicon oxynitride (SiON). The planarization insulating layer 170 may include an organic material, such as acryl, benzocyclobutene (BCB), polyimide, or hexamethyldisiloxane (HMDSO). In FIG. 1, insulating layers from the buffer layer 110 to the planarization insulating layer 170 have been described. According to an embodiment, an additional insulating layer may be further provided according to a structure of the thin-film transistor TFT and the storage capacitor Cst.

The pixel electrode 210 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the pixel electrode 210 may include a reflection film including silver (Ag), magnesium (Mg), aluminum (Al), platinum (Pt), palladium (Pd), gold (Au), nickel (Ni), neodymium (Nd), iridium (Ir), chromium (Cr), or a compound or alloy. According to an embodiment, the pixel electrode 210 may further include a film formed of ITO, IZO, ZnO, or $In_2O_3$ above or below the reflection film.

A pixel defining layer 180 is formed on the substrate 100 where the pixel electrode 210 is formed. The pixel defining layer 180 overlaps/covers an edge of the pixel electrode 210. The pixel defining layer 180 includes an opening 180OP corresponding and exposing to a portion (e.g., a center portion) of the pixel electrode 210. The pixel defining layer 180 includes a side surface 181 that is concavely curved. The side surface 181 is recessed towards the substrate 100. In the cross-sectional view of FIG. 3, the side surface 181 may be recessed such that an angle θ between the substrate 100 and a tangent line/plane LP of the side surface 181 is gradually increased in a direction away from the exposed portion of the pixel electrode 210. There is no significant stepped portion between a top surface of the pixel electrode 210 and the side surface 181 at a first point AP1 where the side surface 181 and the top surface of the pixel electrode 210 meet. The first point AP1 may represent a first edge of the side surface 181. The first edge of the side surface 181 may directly contact the top surface of the pixel electrode 210. Advantageously, a potential problem of disconnection of a first intermediate layer and a first opposite electrode to be formed during following processes and/or a potential problem of deterioration of quality of light emitted from the first intermediate layer may be prevented.

A first vertical distance H1 from the first point AP1 where the top surface of the pixel electrode 210 and the side surface 181 meet to a top surface 183 (a flat surface) of the pixel defining layer 180 may have a value substantially equal to a first horizontal distance L. The first vertical distance H1 may be the vertical distance from the first edge of the side surface 181 to a horizontal plane VP (an imaginary/virtual plane) that includes a second edge of the side surface 181. The first horizontal distance L may be a horizontal distance from the point C1 to the top of the side surface 181, wherein a virtual axis AX1 on the same line as the first vertical distance H1 and the horizontal plane VP containing the top surface 183 meet at the point C1. The first horizontal distance L may be a horizontal distance from a vertical plane (an imaginary/virtual plane) that includes the first edge of the side surface 181 to the second edge of the side surface 181. In an embodiment, in the cross-sectional view, a radius of curvature of the side surface 181 with respect to the point C1 may be substantially constant. The side surface 181 may be a portion (e.g., a quarter) of a cylindrical surface; the point C1 may represent the axis of the cylindrical surface.

The first vertical distance H1 may correspond/equal to a distance from the top surface of the pixel electrode 210 to the top surface 183 of the pixel defining layer 180. The first vertical distance H1 may be shorter than a second vertical distance H2 from the top surface of the planarization insulating layer 170 to the top surface 183 of the pixel defining layer 180. The first vertical distance H1 may in the range of about 500 nm to about 3,000 nm.

The pixel defining layer 180 may include an organic material and/or an inorganic material, and may be a single layer or a multiple-layer structure. The organic material may include an olefin-based organic material, acryl-based organic material, or an imide-based organic material. The imide-based organic material may include, for example, polyimide (PI). The inorganic material may include silicon nitride or silicon oxide.

Figure 4:
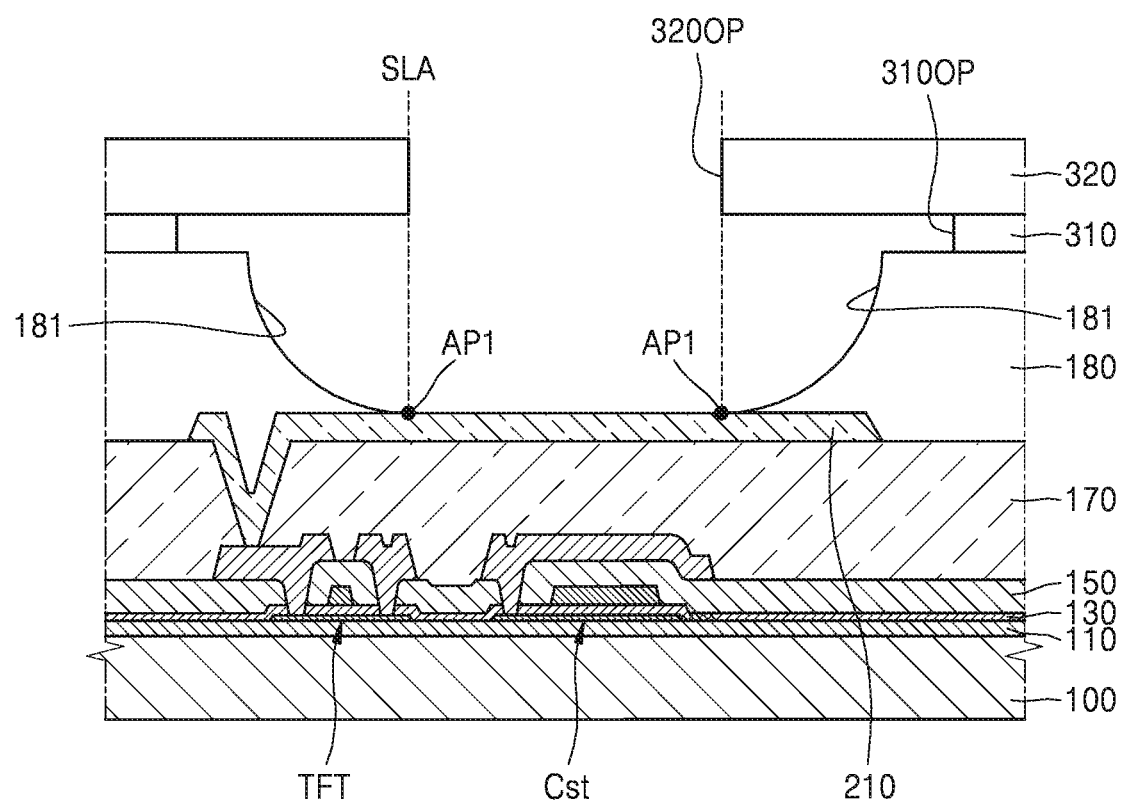
FIG. 4, FIG. 5, FIG. 6, FIG. 7, and FIG. 8 are cross-sectional views illustrating elements in a display device and illustrating structures formed in a method of manufacturing the display device according to an embodiment.

Referring to FIG. 4, a protection resin layer 310 and a photosensitive resin layer 320 are formed on the pixel defining layer 180. According to an embodiment, a non-photosensitive resin layer and a photosensitive resin layer are sequentially formed on the pixel defining layer 180, and an opening region 320OP of the photosensitive resin layer 320 is formed. The opening region 320OP may be formed by exposing and etching a portion of the photosensitive resin layer. Then, an opening region 310OP of the protection resin layer 310 may be formed by selectively removing a portion the non-photosensitive resin layer through the photosensitive resin layer 320.

The non-photosensitive resin layer (and the protection resin layer 310) may be formed of fluorine-based resin. For example, the non-photosensitive resin layer may include 75 wt % to 95 wt % of fluoroether in which a part of hydrogen is substituted with fluorine in an ether structure, and 5 wt % to 25 wt % of resin polymer. In an embodiment, when the non-photosensitive resin layer includes the above-described material, a portion of the non-photosensitive resin layer may be removed by a stripper in the form of a solution including hydrofluoroether, and thus the opening region 310OP may be formed in the protection resin layer 310.

The opening region 310OP of the protection resin layer 310 may be larger than the opening region 320OP of the photosensitive resin layer 320. For example, a width of the opening region 310OP of the protection resin layer 310 may be larger than that of the opening 180OP (see FIG. 3) of the pixel defining layer 180 such that the protection resin layer 310 is located on the top surface 183 of the pixel defining layer 180 without overlapping the side surface 181 of the pixel defining layer 180. The opening region 320OP of the photosensitive resin layer 320 may be smaller than the opening region 310OP of the protection resin layer 310, and may be smaller than the opening 180OP of the pixel defining layer 180. Referring to FIG. 4, the width of the opening region 320OP of the photosensitive resin layer 320 is smaller than the width of the opening region 310OP of the protection resin layer 310 and the widest width of the opening 180OP of the pixel defining layer 180.

The width of the opening region 320OP of the photosensitive resin layer 320 may correspond/equal to a distance between two opposite first points AP1 (i.e., two opposite lower edges of the opening 180OP, or lower edges of two opposite side surfaces 181). An end portion (for example, a side surface) of the photosensitive resin layer 320 that defines the opening region 320OP may be provided on a same line/plane SLA as a first point AP1 (or the lower edge of a side surface 181) in a direction perpendicular to the bottom surface of the substrate 100.

If an end portion of the photosensitive resin layer 320 further extends towards the center of the opening region 320OP (or a center of the pixel electrode 210) beyond the line SLA extending perpendicularly from the first point AP1 (i.e., if the width of the opening region 320OP of the photosensitive resin layer 320 is made smaller than that shown in FIG. 4), an emission region may be narrowed because a width of an intermediate layer to be formed during a following process is not sufficient enough. If the end portion of the photosensitive resin layer 320 does not reach the line SLA (i.e., if the width of the opening region 320OP of the photosensitive resin layer 320 is made larger than that shown in FIG. 4), a profile of an upper surface of the intermediate layer to be formed during a following process is not smooth because a thickness of the intermediate layer rapidly changes. As a result, an inflection point may occur at the upper surface of the intermediate layer in a cross-sectional view. In this case, when the organic light-emitting diode that includes an opposite electrode on the intermediate layer is driven, an electric field may be concentrated at a location of the inflection point, and the pixel may be rendered defective.

Figure 5:
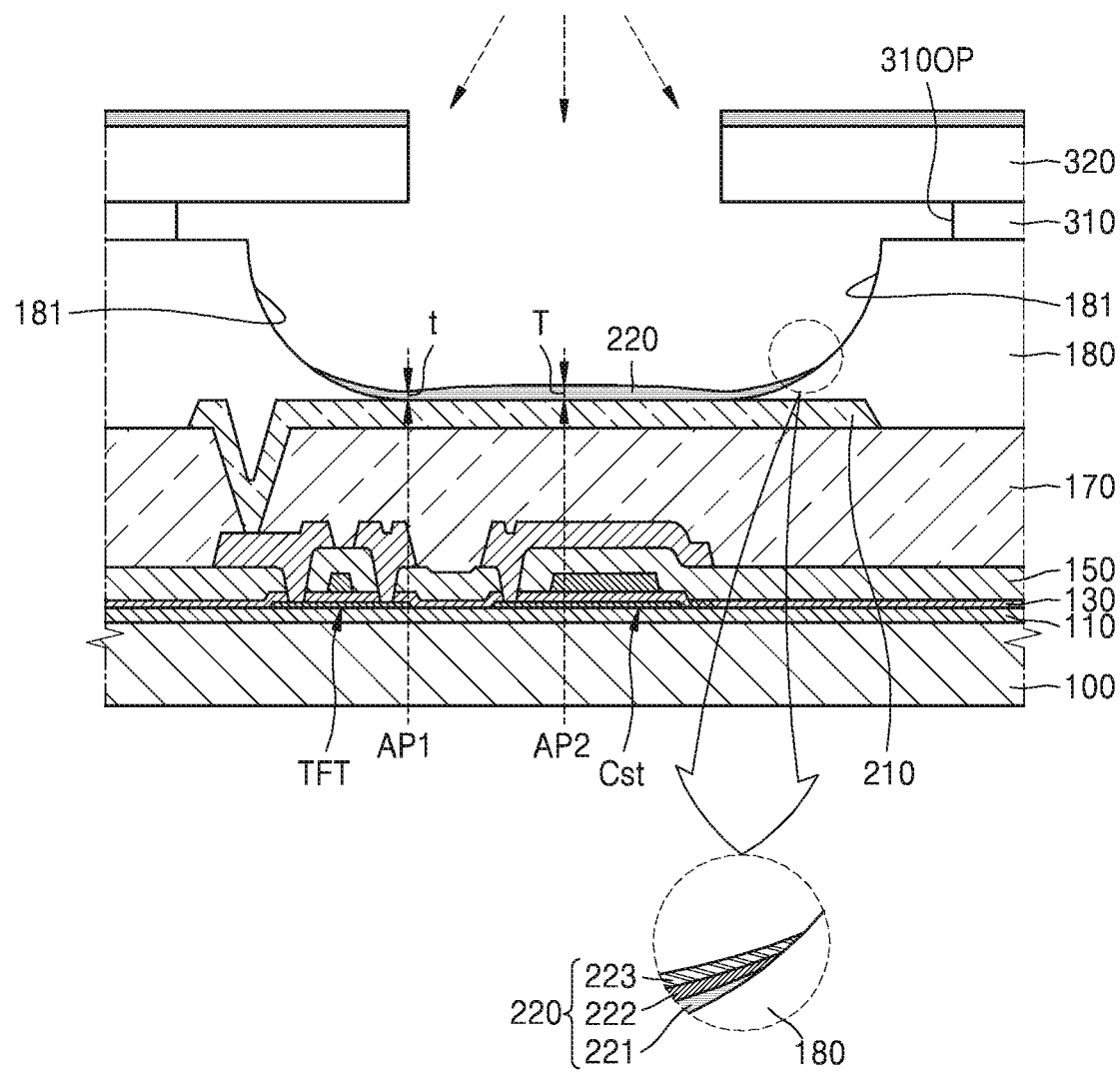

Referring to FIG. 5, an intermediate layer 220 is formed on the pixel electrode 210 through the openings of the protection resin layer 310 and the photosensitive resin layer 320. The intermediate layer 220 may be formed via a thermal evaporation method, according to an embodiment. A layer with material(s) identical to the material(s) used for forming the intermediate layer 220 may also be deposited on the photosensitive resin layer 320.

The material(s) for the intermediate layer 220 may be deposited on the pixel electrode 210 through the opening region 320OP of the photosensitive resin layer 320. The material(s) move along a perpendicular direction and oblique directions with respect to an upper surface of the substrate 100. Accordingly, the at least one material used forming the intermediate layer 220 is provided on the top surface of the pixel electrode 210 and the side surface 181 of the pixel defining layer 180. Since the side surface 181 has a concave shape and is smooth, and since the side surface 181 is not stepped from the top surface of the pixel electrode 210, the intermediate layer 220 and an opposite electrode may be formed without significant defects or damage.

The intermediate layer 220 has different thicknesses at different regions. For example, a first thickness t of the intermediate layer 220 at the first point AP1 (or the lower edge of a side surface 181) may be smaller than a second thickness T of the intermediate layer 220 at a second point AP2 corresponding to a portion of the pixel electrode 210 no covered by the pixel defining layer 180, e.g., the center of the pixel electrode 210. A difference between the first thickness t and the second thickness T may be based on the curved side surface 181 of the pixel defining layer 180. The first thickness t may be in a range of about 0.45 to 0.5 times the second thickness T. The thickness of the intermediate layer 220 may decrease in a direction from the second point AP2 to the first point AP1.

The intermediate layer 220 includes an emission layer 222. The emission layer 222 may include an organic material. The intermediate layer 220 may include at least one of a first functional layer 221 and a second functional layer 223, which are respectively arranged below and above the emission layer 222. The first functional layer 221 may include at least one of a hole injection layer (HIL) and a hole transport layer (HTL) The second functional layer 223 may include at least one of an electron transport layer (ETL) and an electron injection layer (EIL).

If the intermediate layer 220 includes a low-molecular weight material, the intermediate layer 220 may have a structure in which the HIL, the HTL, an emission layer (EML), the ETL, the EIL, etc. are stacked in a single or complex structure. If the intermediate layer 220 includes a low-molecular weight material, the intermediate layer 220 may include both the first and second functional layers 221 and 223. If the intermediate layer 220 includes a high-molecular weight material, the intermediate layer 220 may include the emission layer 222 and the first functional layer 221, such as a HTL, below the emission layer 222.

Referring to an enlarged view in FIG. 5, an end portion of the first functional layer 221 is located on the curved side surface 181 of the pixel defining layer 180 and is covered by the emission layer 222. The end portion of the emission layer 222 may extend over the side surface 181 beyond the end portion of the first functional layer 221 and may directly contact the side surface 181. The end portion of the second functional layer 223 may extend over the side surface 181 beyond the end portion of the emission layer 222 and may directly contact the side surface 181.

Figure 6:
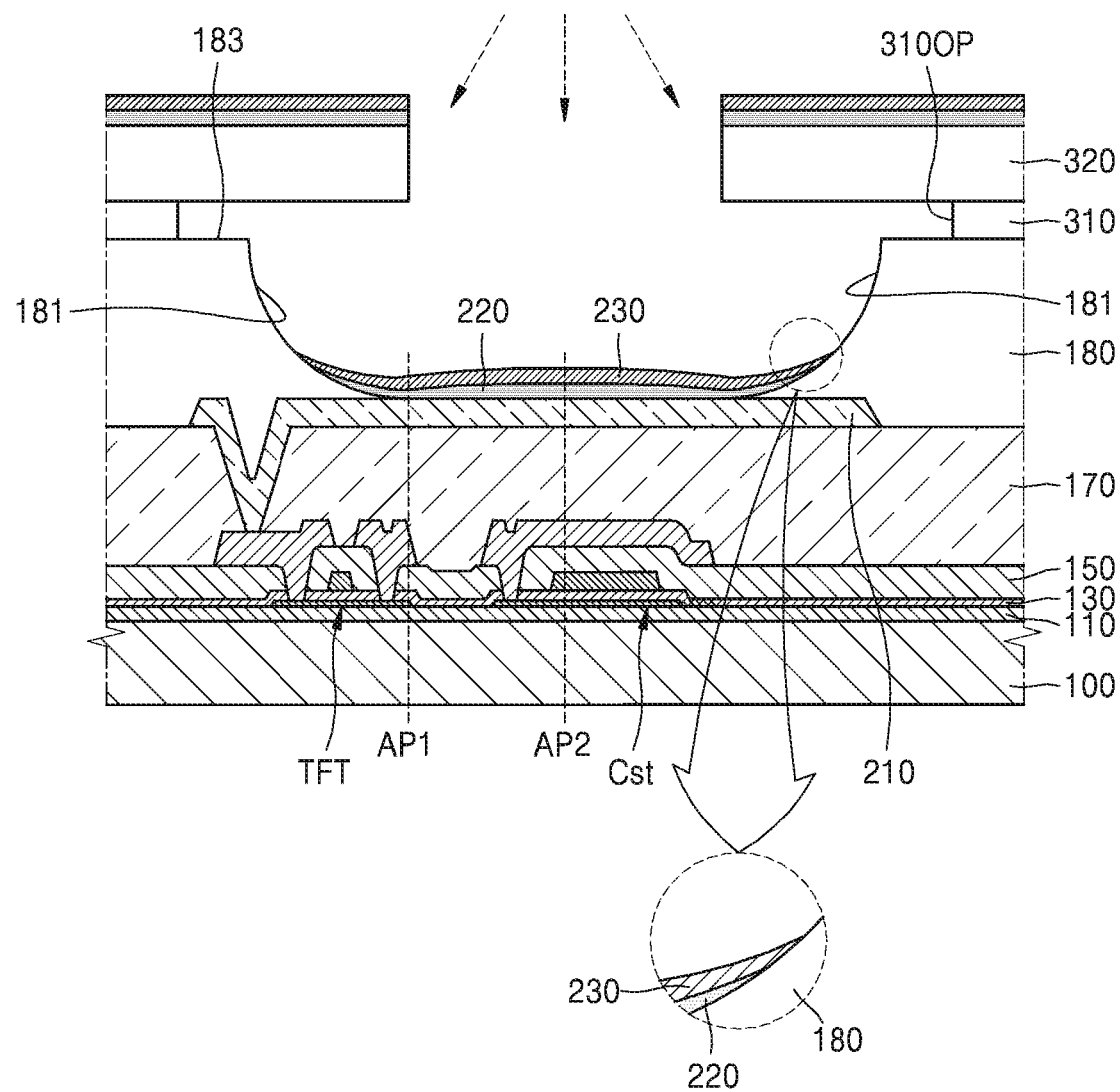

Referring to FIG. 6, an opposite electrode 230 is formed on the intermediate layer 220. The opposite electrode 230 may be formed via a thermal evaporation method or a sputtering method. Material(s) for forming the opposite electrode 230 may move along a perpendicular direction and oblique directions with respect to the upper surface of the substrate 100. Accordingly, the material(s) forming the opposite electrode 230 is located on the top surface of the intermediate layer 220 and the side surface 181 of the pixel defining layer 180. Because of the curved side surface 181 of the pixel defining layer 180, the opposite electrode 230 may be formed without disconnection/damage or undesirable rapid sloping (for example, a portion having an inflection point).

The opposite electrode 230 has different thicknesses at different regions. The thickness of the opposite electrode 230 at the first point AP1 (or a lower edge of a side surface 181) may be smaller than the thickness of the opposite electrode 230 at the second point AP2 (or a portion of the pixel electrode not covered by the pixel defining layer 180). The opposite electrode 230 may have a substantially gradually-sloped top surface without an undesirable inflection point.

The opposite electrode 230 may be formed of a conductive material having a low work function. For example, the opposite electrode 230 may include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy. According to an embodiment, the opposite electrode 230 may include Al, Ag, and an alloy of Mg and Ag (Mg:Ag).

Referring to an enlarged view in FIG. 6, the end portion of the opposite electrode 230 may extend over the side surface 181 beyond the end portion of the intermediate layer 220. The end portion of the opposite electrode 230 may directly contact the side surface 181. The end portion of the opposite electrode 230 does not extend up to the top surface 183 of the pixel defining layer 180.

Figure 7:
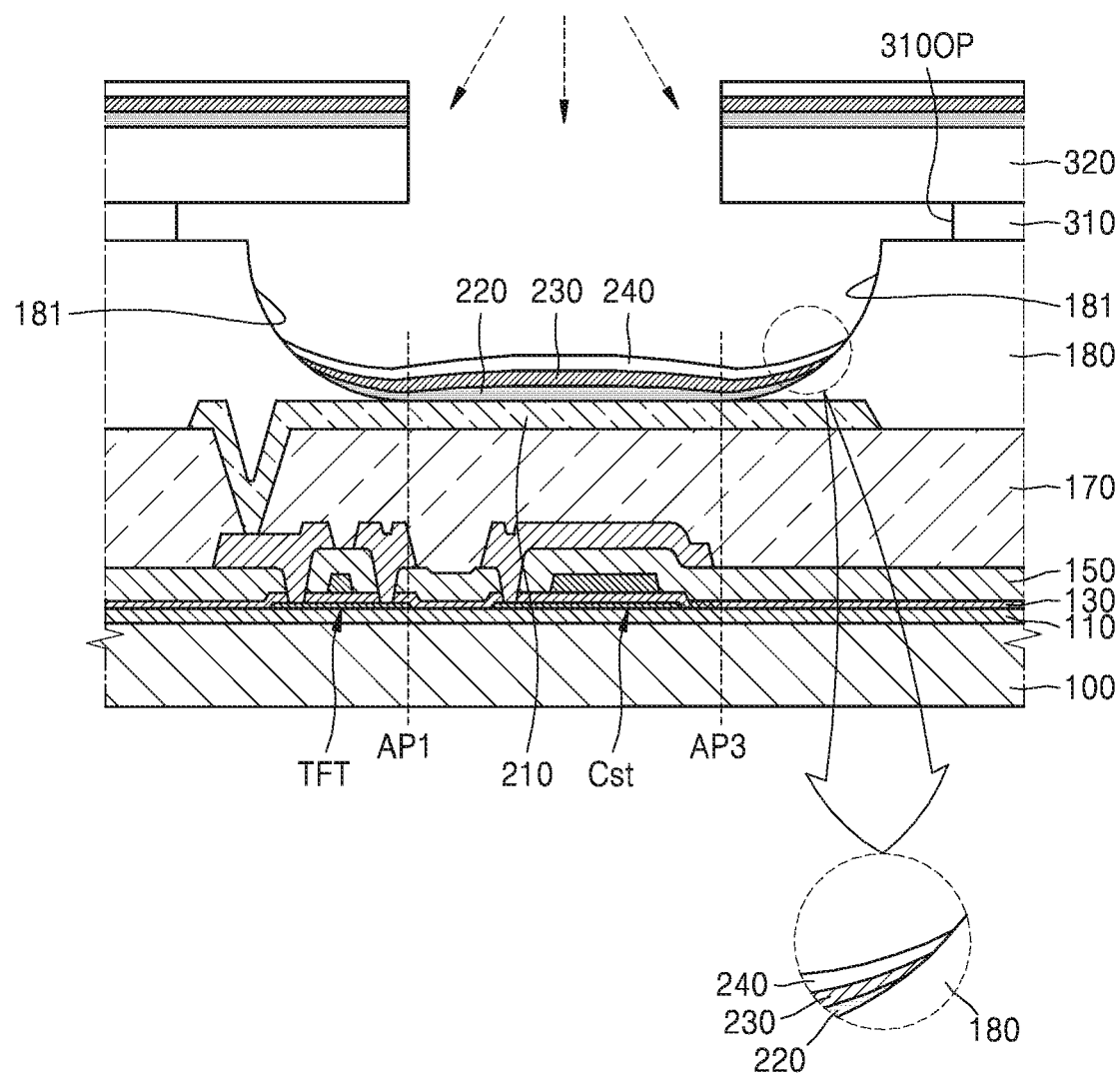
Figure 8:
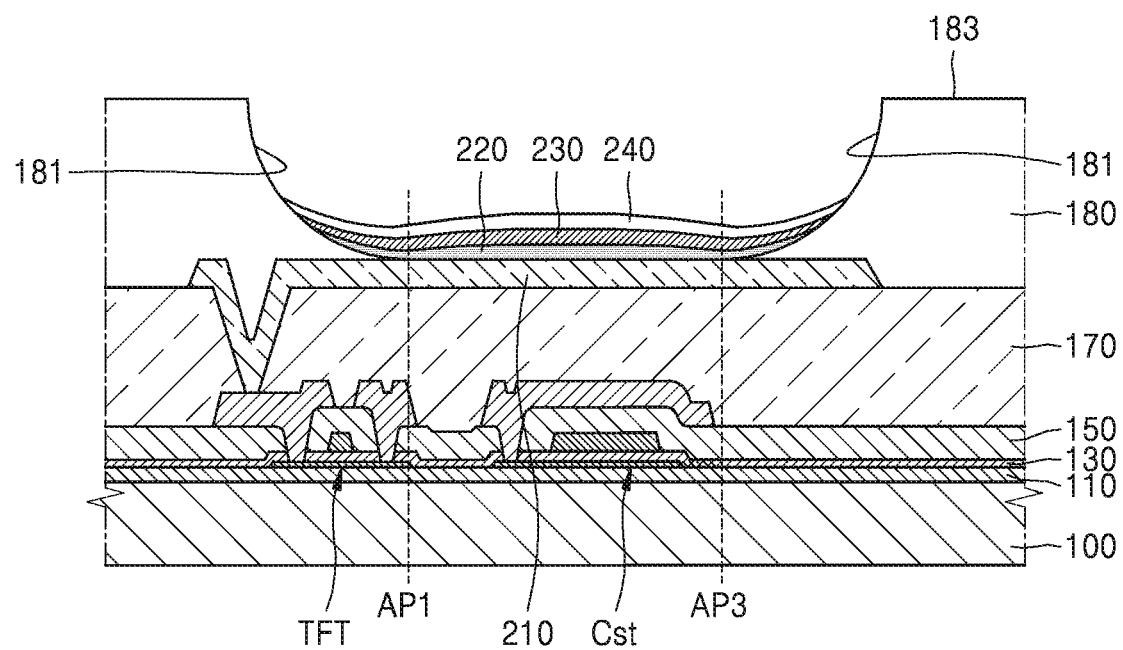

Referring to FIG. 7, a protection layer 240 is formed on the opposite electrode 230. The protection layer 240 is formed using the protection resin layer 310 and the photosensitive resin layer 32 as a mask. The protection layer 240 may include a material having relatively high electric conductivity and a relatively low water vapor transmission rate (WVTR). For example, the protection layer 240 may include a conductive material, such as ITO. The protection layer 240 may be formed via a sputtering method.

Material for forming the protection layer 240 may move along a perpendicular direction and oblique directions with respect to the upper surface of the substrate 100. Accordingly, the material is provided on the top surface of the opposite electrode 230 and the side surface 181 of the pixel defining layer 180. As shown in an enlarged view in FIG. 7, an end portion of the protection layer 240 extends over the side surface 181 beyond the end portion of the opposite electrode 230 and may directly contact the side surface 181 of the pixel defining layer 180.

Subsequently, the protection resin layer 310 is removed through a lift-off process. For example, the protection resin layer 310 may be removed using a solution including hydrofluoroether. When the protection resin layer 310 is removed, the photosensitive resin layer 320 on the protection resin layer 310 and materials deposited on the photosensitive resin layer 320 are also removed. As a result, the intermediate layer 220, the opposite electrode 230, and the protection layer 240 are left on the pixel electrode 210. The pixel electrode 210, the intermediate layer 220, and the opposite electrode 230 may constitute a display element, such as an organic light-emitting diode. Since the intermediate layer 220, the opposite electrode 230, and/or the protection layer 240, which do not have undesirable inflection points, are formed according to a structure of the curved side surface 181 of the pixel defining layer 180, the display element may have minimum defects or damage.

An end portion of each of the intermediate layer 220, the opposite electrode 230, and the protection layer 240 is located on a side surface 181 of the pixel defining layer 180, but may not directly contact the top surface 183 of the pixel defining layer 180.

The protection layer 240 is formed in the display device according to an embodiment. According to an embodiment, the protection layer 240 may be unnecessary.

FIGS. 9 through 13 are cross-sectional views illustrating elements in a display device and illustrating structures formed in a method of manufacturing a display device, according to an embodiment.

Figure 9:
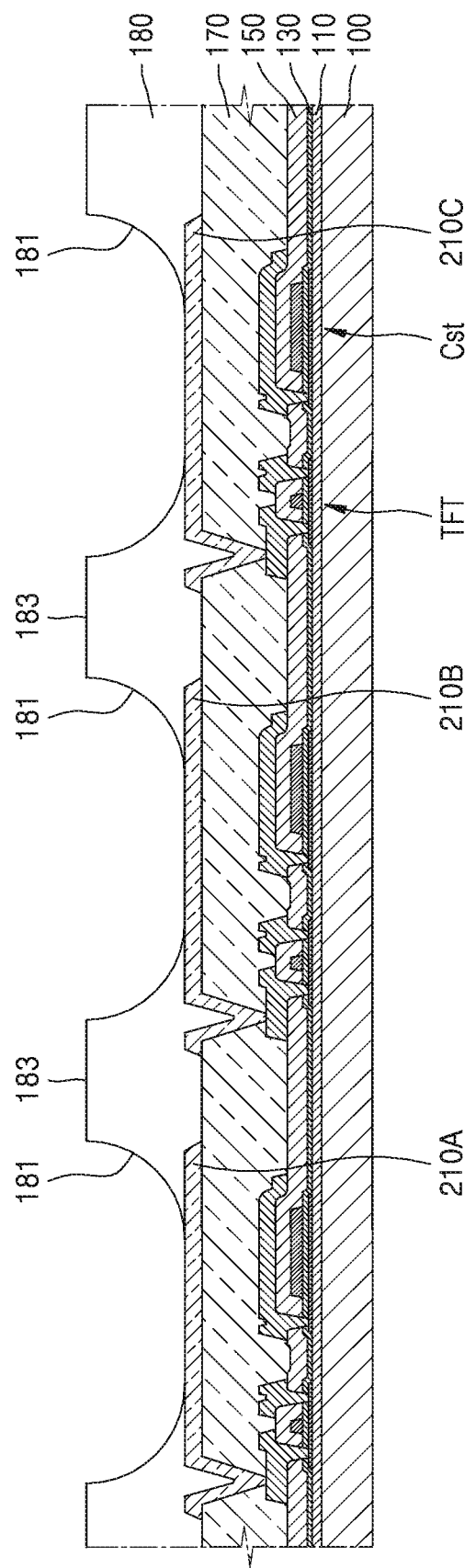
FIG. 9, FIG. 10, FIG. 11, FIG. 12, and FIG. 13 are cross-sectional views illustrating elements in a display device and illustrating structures formed in a method of manufacturing the display device according to an embodiment.

Referring to FIG. 9, first, second, third pixel electrodes 210A, 210B, and 210C are formed on the substrate 100. As described with reference to FIG. 3, a thin-film transistor TFT, a storage capacitor Cst, and an insulating layers may be formed between the substrate 100 and each of the first through third pixel electrodes 210A through 210C.

The pixel defining layer 180 is formed on and partially covers the first through third pixel electrodes 210A through 210C. The pixel defining layer 180 includes an opening partially exposing each of the first through third pixel electrodes 210A through 210C, and may include side surfaces 181 and top surfaces 183 between immediately neighboring side surfaces 181. Structural and material characteristics of the pixel defining layer 180 are as described above with reference to FIG. 3.

Figure 10:
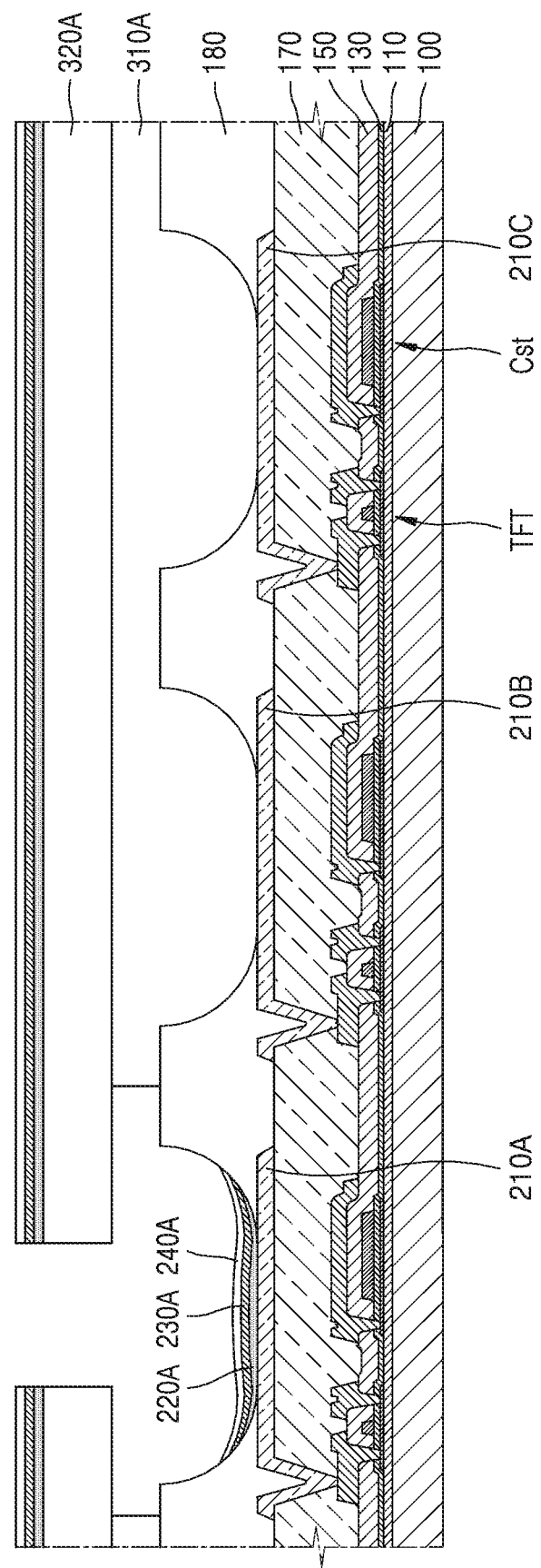

Referring to FIG. 10, a first protection resin layer 310A and a first photosensitive resin layer 320A are formed on the pixel defining layer 180. A first intermediate layer 220A, a first opposite electrode 230A, and a first protection layer 240A are sequentially formed (deposited) on the first pixel electrode 210A.

The first protection resin layer 310A and the first photosensitive resin layer 320A include openings corresponding to and exposing the first pixel electrode 210A, and thus deposited materials are located on the first pixel electrode 210A.

Characteristics of the first protection resin layer 310A and the first photosensitive resin layer 320A and processes of forming the first intermediate layer 220A, the first opposite electrode 230A, and the first protection layer 240A using the first protection resin layer 310A and the first photosensitive resin layer 320A are substantially the same as those described with reference to FIGS. 4 through 8.

When the first protection resin layer 310A is removed through a lift-off process, the first photosensitive resin layer 320A and deposited materials on the first photosensitive resin layer 320A are also removed; the first intermediate layer 220A, the first opposite electrode 230A, and the first protection layer 240A remain on the first pixel electrode 210A and on the substrate 100.

Figure 11:
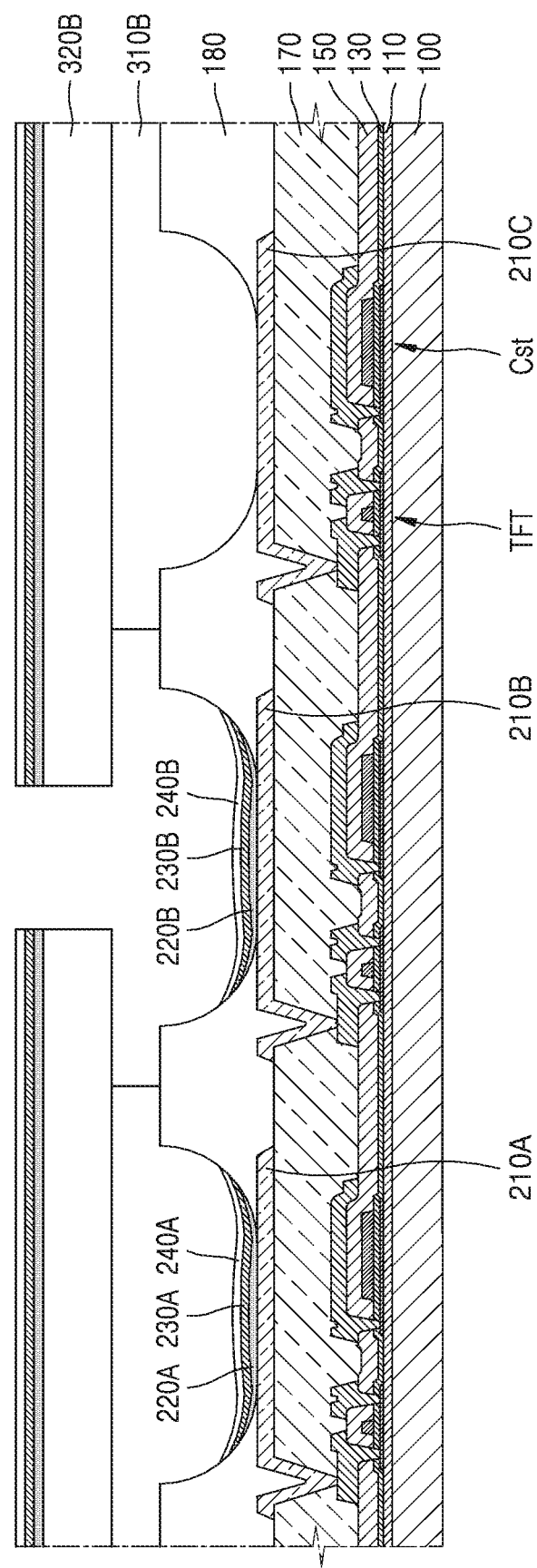

Referring to FIG. 11, a second protection resin layer 310B and a second photosensitive resin layer 320B are formed on the substrate 100. A second intermediate layer 220B, a second opposite electrode 230B, and a second protection layer 240B are sequentially formed (deposited) on the second pixel electrode 210B.

The second protection resin layer 310B and the second photosensitive resin layer 320B include openings corresponding to and exposing the second pixel electrode 210B, and thus deposited materials are located on the second pixel electrode 210B.

Characteristics of the second protection resin layer 310B and the second photosensitive resin layer 320B and processes of forming the second intermediate layer 220B, the second opposite electrode 230B, and the second protection layer 240B by using the second protection resin layer 310B and the second photosensitive resin layer 320B are substantially the same as those described with reference to FIGS. 4 through 8. An emission layer of the second intermediate layer 220B may include a material for emitting a colored light different from that of an emission layer of the first intermediate layer 220A.

When the second protection resin layer 310B is removed through a lift-off process, the second photosensitive resin layer 320B and deposited materials on the second photosensitive resin layer 320B are also removed; the second intermediate layer 220B, the second opposite electrode 230B, and the second protection layer 240B remain on the second pixel electrode 210B and on the substrate 100.

Figure 12:
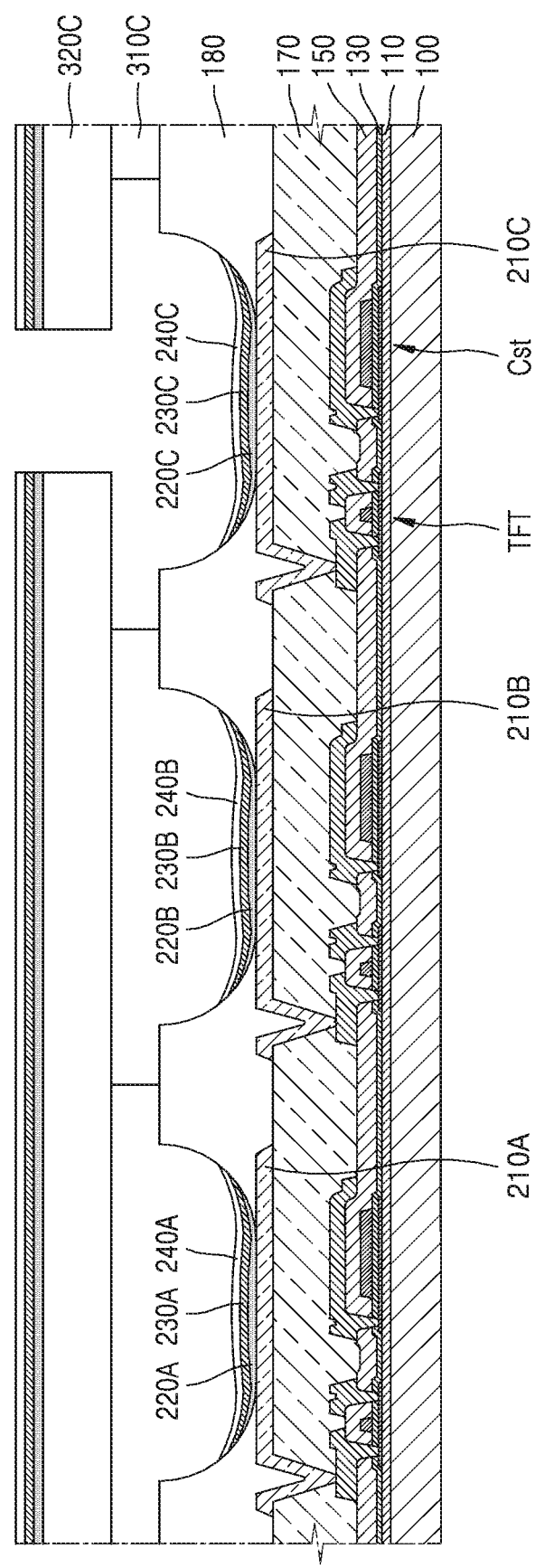

Referring to FIG. 12, a third protection resin layer 310C and a third photosensitive resin layer 320C are formed on the substrate 100. A third intermediate layer 220C, a third opposite electrode 230C, and a third protection layer 240C are sequentially formed (deposited) on the third pixel electrode 210C.

The third protection resin layer 310C and the third photosensitive resin layer 320C include openings corresponding to and exposing the third pixel electrode 210C, and thus deposited materials are located on the third pixel electrode 210C.

Characteristics of the third protection resin layer 310C and the third photosensitive resin layer 320C and processes of forming the third intermediate layer 220C, the third opposite electrode 230C, and the third protection layer 240C by using the third protection resin layer 310C and the third photosensitive resin layer 320C are substantially the same as those described with reference to FIGS. 4 through 8. An emission layer of the third intermediate layer 220C may include a material for emitting a colored light different from those of emission layers of the first and second intermediate layers 220A and 220B. For example, the first through third intermediate layers 220A through 220C may respectively emit red, green, and blue lights.

Figure 13:
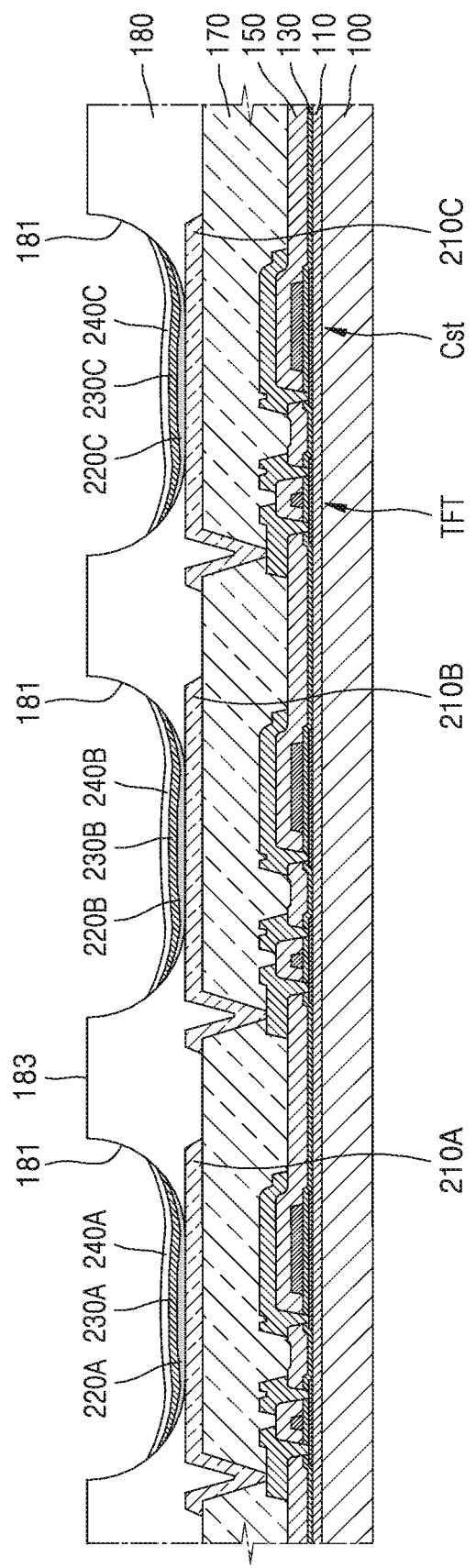

Referring to FIG. 12 and FIG. 13, when the third protection resin layer 310C is removed through a lift-off process, the third photosensitive resin layer 320C and deposited materials on the third photosensitive resin layer 320C are also removed; the third intermediate layer 220C, the third opposite electrode 230C, and the third protection layer 240C may remain on the third pixel electrode 210C and on the substrate 100.

The first through third opposite electrodes 230A through 230C respectively corresponding to the first through third pixel electrodes 210A through 210C are spaced apart from each other. An end portion of each of the first through third opposite electrodes 230A through 230C may contact a side surface 181 of the pixel defining layer 180, but may not contact any top surface 183. Analogous structures may be applied to the first through third protection layers 240A through 240C.

According to embodiments, smoothly-sloped profiles of layers, such as an intermediate layer and an opposite electrode, which are deposited on a pixel electrode and a curved side surface of a pixel defining layer, may be maintained. Accordingly, no electric field may undesirably concentrate on a certain portion of the above layer(s) while a display element operates, and thus satisfactory quality of the corresponding pixel may be attained. In embodiments, the density of each layer may be substantially uniform, and thus layers may have satisfactory quality.

While embodiments have been described with reference to the figures, various changes may be made without departing from the spirit and scope defined by the following claims.

What is claimed is:

1. A display device comprising:
    a substrate;
    a plurality of pixel electrodes overlapping the substrate and including a first pixel electrode;
    a pixel defining layer comprising a concave surface that partially overlaps the first pixel electrode and exposes an exposed surface portion of the first pixel electrode;
    a first intermediate layer comprising an intermediate surface and a convex surface portion, wherein a part of the concave surface is positioned between the first intermediate layer and the first pixel electrode, and wherein the intermediate surface of the first intermediate layer is positioned between the convex surface portion of the first intermediate layer and the exposed surface portion of the first pixel electrode and overlaps each of the convex surface portion of the first intermediate layer and the exposed surface portion of the first pixel electrode; and
    a first opposite electrode overlapping the concave surface, wherein the first intermediate layer is positioned between the first opposite electrode and the part of the concave surface.

2. The display device of claim 1,
    wherein a first imaginary plane is perpendicular to a face of the substrate,
    wherein a second imaginary plane is parallel to the face of the substrate,
    wherein the concave surface includes a first edge and a second edge,
    wherein the first edge is positioned in the first imaginary plane and directly contacts the first pixel electrode,
    wherein the second edge is positioned in the second imaginary plane, and
    wherein a vertical distance from the first edge to the second imaginary plane is substantially equal to a horizontal distance from the first imaginary plane to the second edge.

3. The display device of claim 2, wherein the vertical distance is in a range from 500 nm to 3000 nm.

4. The display device of claim 1,
    wherein an edge of the concave surface is positioned between a first portion of the first intermediate layer and the first pixel electrode in a direction that is perpendicular to a face of the substrate,
    wherein the pixel defining layer comprises an opening overlapping a portion of the first pixel electrode,
    wherein a second portion of the first intermediate layer is positioned on the portion of the first pixel electrode, and
    wherein a thickness of the first portion of the first intermediate layer in the direction is smaller than a thickness of the second portion of the first intermediate layer in the direction.

5. The display device of claim 4, wherein the thickness of the first portion of the first intermediate layer is in a range of 0.45 to 0.5 times the thickness of the second portion of the first intermediate layer.

6. The display device of claim 4, wherein a thickness of the first intermediate layer decreases from the portion of the first pixel electrode towards the edge of the concave surface.

7. The display device of claim 1, wherein the first opposite electrode extends beyond the first intermediate layer, partially overlaps the concave surface, and directly contacts the concave surface.

8. The display device of claim 1, wherein the first intermediate layer comprises:
    a first emission layer for emitting a first colored light; and
    at least one of a first functional layer between the first pixel electrode and the first emission layer and a second functional layer between the first emission layer and the first opposite electrode.

9. The display device of claim 8, wherein the first intermediate layer comprises the first functional layer, and
    wherein the first emission layer extends beyond the first functional layer and directly contacts the concave surface.

10. The display device of claim 8, wherein the first intermediate layer comprises the second functional layer, and
    wherein the second functional layer extends beyond the first emission layer and directly contacts the concave surface.

11. The display device of claim 10, wherein the first opposite electrode extends beyond the second functional layer and directly contacts the concave surface.

12. The display device of claim 11, wherein the pixel defining layer has a flat surface connected to the concave surface, and
    wherein the first opposite electrode does not directly contact the flat surface.

13. The display device of claim 1, further comprising a first protection layer, wherein the first opposite electrode is positioned between the first protection layer and the first intermediate layer, and wherein an end portion of the first protection layer directly contacts the concave surface.

14. A method of manufacturing a display device, the method comprising:
    preparing a substrate;
    providing pixel electrodes on the substrate, the pixel electrodes including a first pixel electrode and a second pixel electrode;
    forming a pixel defining layer comprising a first concave surface that partially overlaps the first pixel electrode and a second concave surface that partially overlaps the second pixel electrode;
    forming a first intermediate layer, wherein a part of the first concave surface is positioned between the first intermediate layer and the first pixel electrode, wherein the first intermediate layer comprises a convex surface portion and a concave surface portion, wherein the concave surface portion is positioned between the convex surface portion and the first concave surface and is directly connected to each of the convex surface portion and the first concave surface; and forming a first opposite electrode, wherein the first intermediate layer is positioned between the first opposite electrode and the part of the first concave surface, wherein the pixel defining layer includes connected surface connected between the first concave surface and the second concave surface.

15. The method of claim 14, further comprising:

providing a photosensitive resin layer comprising an opening that exposes the first pixel electrode, wherein at least one of the first intermediate layer and first opposite electrode is formed using the photosensitive resin layer, wherein an edge of the opening is aligned with an edge of the concave surface in a direction perpendicular to the substrate, and wherein the first pixel electrode directly contacts the edge of the concave surface.

16. The method of claim 14, wherein the pixel defining layer includes an opening overlapping a portion of the first pixel electrode, and wherein, in a direction perpendicular to the substrate, a first thickness of the first intermediate layer at an edge of the concave surface is smaller than a second thickness of the first intermediate layer at the portion of the first pixel electrode.

17. The method of claim 16, wherein the first thickness is in a range of 0.45 to 0.5 times the second thickness.

18. The method of claim 16, wherein a thickness of the first intermediate layer decreases from the portion of the first pixel electrode towards the edge of the concave surface.

19. The method of claim 14, wherein the first opposite electrode extends beyond the first intermediate layer and directly contacts the concave surface.

20. The method of claim 14, further comprising:

forming a second intermediate layer, wherein a part of the second concave surface is positioned between the second intermediate layer and the second pixel electrode; and forming a second opposite electrode, wherein the second intermediate layer is positioned between the second opposite electrode and the part of the second concave surface, wherein the first opposite electrode does not directly contact the upper surface, and wherein the second opposite electrode is apart from the first opposite electrode.

* * * * *